(12) United States Patent
Kwak et al.

(10) Patent No.: US 8,183,097 B2
(45) Date of Patent: May 22, 2012

(54) THIN-FILM TRANSISTOR SUBSTRATE AND METHOD OF MANUFACTURING THE SAME

(75) Inventors: Sang-Ki Kwak, Cheonan-si (KR); Hyang-Shik Kong, Seongnam-si (KR); Sun-Il Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 60 days.

(21) Appl. No.: 12/186,659

(22) Filed: Aug. 6, 2008

(65) Prior Publication Data

US 2009/0108256 A1 Apr. 30, 2009

(30) Foreign Application Priority Data

Oct. 31, 2007 (KR) .................. 10-2007-0110056

(51) Int. Cl.
*H01L 27/88* (2006.01)
(52) U.S. Cl. .......... 438/149; 438/29; 257/223; 257/292; 257/E27.1; 257/E27.125; 257/E27.112; 257/E29.117; 257/E29.182; 257/59; 257/43; 257/E27.06; 257/E21.535
(58) Field of Classification Search ............ 257/43, 257/192, 59, E27.06, E27.535, 655, 439, 257/E27.1, E27.125, E29.117, E29.182; 438/29, 438/149
See application file for complete search history.

(56) References Cited

U.S. PATENT DOCUMENTS

| 5,646,705 | A * | 7/1997 | Higuchi et al. | 349/143 |
| 6,429,916 | B1 * | 8/2002 | Nakata et al. | 349/106 |
| 7,105,868 | B2 * | 9/2006 | Nause et al. | 257/192 |
| 2004/0127038 | A1 * | 7/2004 | Carcia et al. | 438/689 |
| 2006/0060560 | A1 * | 3/2006 | Kido | 216/23 |
| 2007/0108446 | A1 * | 5/2007 | Akimoto | 257/61 |
| 2007/0290229 | A1 * | 12/2007 | Choi et al. | 257/192 |
| 2008/0002126 | A1 * | 1/2008 | Lim et al. | 349/141 |
| 2009/0108304 | A1 * | 4/2009 | Ng et al. | 257/288 |

FOREIGN PATENT DOCUMENTS

| CN | 1693973 | 11/2005 |
| CN | 101060139 | 10/2007 |

* cited by examiner

*Primary Examiner* — Marc Armand
(74) *Attorney, Agent, or Firm* — F. Chau & Associates, LLC

(57) ABSTRACT

A thin-film transistor (TFT) substrate includes a semiconductor pattern, a conductive pattern, a first wiring pattern, an insulation pattern and a second wiring pattern. The semiconductor pattern is formed on a substrate. The conductive pattern is formed as a layer identical to the semiconductor pattern on the substrate. The first wiring pattern is formed on the semiconductor pattern. The first wiring pattern includes a source electrode and a drain electrode spaced apart from the source electrode. The insulation pattern is formed on the substrate having the first wiring pattern to cover the first wiring pattern. The second wiring pattern is formed on the insulation pattern. The second wiring pattern includes a gate electrode formed on the source and drain electrodes. Therefore, a TFT substrate is manufactured using two or three masks, so that manufacturing costs may be decreased.

8 Claims, 18 Drawing Sheets

THIN-FILM TRANSISTOR SUBSTRATE AND METHOD OF MANUFACTURING THE SAME

CROSS-REFERENCE TO RELATED APPLICATION

This application claims priority under 35 U.S.C. §119 to Korean Patent Application No. 2007-110056, filed on Oct. 31, 2007, the contents of which are herein incorporated by reference in their entirety.

BACKGROUND OF THE INVENTION

1. Technical Field

The present disclosure relates to a thin-film transistor (TFT) substrate and a method of manufacturing the TFT substrate, and more particularly, to a TFT substrate used in a display device for displaying images and a method of manufacturing the TFT substrate.

2. Discussion of the Related Art

A liquid crystal display (LCD) device includes a thin-film transistor (TFT) substrate, a color filter substrate facing the TFT substrate, and a liquid crystal layer interposed between the TFT substrate and the color filter substrate.

The TFT substrate includes a signal wiring formed on an insulation substrate to drive, for example, a plurality of pixels, a TFT, and/or a pixel electrode. The color filter substrate includes a color filter layer including a red filter, a green filter and a blue filter, and a common electrode facing the pixel electrode.

Since a manufacturing process of the TFT substrate is performed through a photo etching process using a mask, manufacturing costs can be lowered and the productivity can be enhanced by decreasing the number of masks used in the photo etching process.

A four-mask process includes a patterning of an active pattern and a data wiring through one mask process. In the four-mask process, a transmittance ratio of a predetermined area can be controlled using a slit mask or a half-tone mask to form an edge portion of a photoresist pattern. The active pattern and the data wiring are patterned through a combination of an etching process and an ashing process.

However, a mask-less technology may complicate a manufacturing process, such that yield and light transmittance are decreased.

SUMMARY OF THE INVENTION

According exemplary embodiments of the present invention, a thin-film transistor (TFT) substrate with a low resistance wiring formed by mask-less technology and a method of manufacturing same are provided.

According to an exemplary embodiment of the present invention, a thin-film transistor (TFT) substrate includes a semiconductor pattern formed on a substrate, a conductive pattern formed as a layer identical to the semiconductor pattern on the substrate, a first wiring pattern formed on the semiconductor pattern, the first wiring pattern comprising a source electrode and a drain electrode spaced apart from the source electrode, an insulation pattern formed on the substrate having the first wiring pattern to cover the first wiring pattern, and a second wiring pattern formed on the insulation pattern, the second wiring pattern comprising a gate electrode formed on the source and drain electrodes.

The semiconductor pattern may include a metal oxide semiconductor.

The metal oxide semiconductor may include zinc oxide (ZnO).

The metal oxide semiconductor may include at least one of indium (In) and gallium (Ga).

The conductive pattern includes a conductive oxide material formed through a plasma process of the metal oxide semiconductor.

The first wiring pattern may further comprise a data line electrically connected to the source electrode.

The conductive pattern comprises, a pixel electrode electrically connected to the drain electrode; and a data pad electrically connected to the data line.

The second wiring pattern may further comprise a gate line electrically connected to the gate electrode, and a gate pad electrically connected to the gate line.

The first wiring pattern may further comprise a first maintaining electrode for forming a maintaining capacitor, and the second wiring pattern further comprises a second maintaining electrode overlapping the first maintaining electrode to form a maintaining capacitor.

The TFT substrate may further comprise a color filter layer formed on a substrate having the second wiring pattern, and a black matrix formed on the substrate having the second wiring pattern.

According to an exemplary embodiment of the present invention, a thin-film transistor (TFT) substrate comprises a semiconductor pattern formed on a substrate, the semiconductor pattern including a metal oxide semiconductor, a first wiring pattern formed on the semiconductor pattern, the first wiring pattern comprising a source electrode and a drain electrode spaced apart from the source electrode, an insulation pattern formed on the substrate having the first wiring pattern, the insulation pattern covering the first wiring pattern, a second wiring pattern formed on the insulation pattern, the second wiring pattern comprising a gate electrode formed on the source and drain electrodes, and a conductive pattern formed on the substrate, the conductive pattern including a pixel electrode electrically connected to the drain electrode.

The TFT substrate may further comprise a color filter layer formed on the substrate having the second wiring pattern, and a light-blocking layer formed on the substrate having the second wiring pattern, wherein the conductive pattern is formed on the color filter layer and the light-blocking layer.

According to an exemplary embodiment of the present invention, a method of manufacturing a thin-film transistor (TFT) substrate comprises forming a semiconductor pattern layer on a substrate and a first wiring pattern on the semiconductor pattern layer using a first mask, the first wiring pattern including a source electrode and a drain electrode spaced apart from the source electrode, forming an insulation layer pattern covering the first wiring pattern and a second wiring pattern on the insulation layer pattern using a second mask, the second wiring pattern including a gate electrode formed on the source and drain electrodes, and forming a conductive pattern and a semiconductor pattern through a plasma process on a portion of the semiconductor pattern layer.

Forming the semiconductor pattern layer and the first wiring pattern may comprise forming a metal oxide semiconductor and then a first conductive layer, forming a first photoresist pattern on the first conductive layer using the first mask, etching the first conductive layer and the metal oxide semiconductor to form a first conductive pattern layer from the first conductive layer and a second conductive pattern layer from the metal oxide semiconductor layer, performing an etch back process to the first photoresist pattern to form a second photoresist pattern, and etching the first conductive pattern to form the first wiring pattern.

Forming the insulation layer pattern and the second wiring pattern may comprise forming an insulation layer and then a second conductive layer on a substrate having the first wiring pattern, forming a third photoresist pattern on the second conductive layer using the second mask, etching the second conductive layer to form a second conductive pattern layer, etching the insulation layer to form the insulation layer pattern, performing an etch back process to the third photoresist pattern to form a fourth photoresist pattern, and etching the second conductive pattern layer to form a second wiring pattern.

In etching the insulation layer to form the insulation layer pattern, the insulation layer can be etched to expose a portion of an edge of the first wiring pattern.

The plasma process of the semiconductor pattern layer may use the first and second wiring patterns as a mask.

The method may further comprise forming a color filter layer and a black matrix after forming the conductive pattern and the semiconductor pattern.

According to an exemplary embodiment of the present invention, a method of manufacturing a thin-film transistor (TFT) substrate comprises forming a semiconductor pattern on a substrate and a first wiring pattern on the semiconductor pattern using a first mask, wherein the semiconductor pattern includes a metal oxide semiconductor, and the first wiring pattern includes a source electrode and a drain electrode spaced apart from the source electrode, forming an insulation layer pattern covering the first wiring pattern and a second wiring pattern on the insulation layer pattern using a second mask, the second wiring pattern including a gate electrode formed on the source and drain electrodes, and forming a conductive pattern on the insulation layer pattern using a third mask, the conductive pattern including a pixel electrode electrically connected to the drain electrode.

The method may further comprise forming a color filter layer and a light-blocking layer after forming the insulation layer pattern and the second wiring pattern.

BRIEF DESCRIPTION OF THE DRAWINGS

Exemplary embodiments of the present invention can be understood in more detail from the following descriptions taken in conjunction with the accompanying drawings in which.

DESCRIPTION OF EXEMPLARY EMBODIMENTS

The invention is described more fully hereinafter with reference to the accompanying drawings, in which embodiments of the invention are shown. This invention may, however, be embodied in many different forms and should not be construed as limited to the embodiments set forth herein. It will be understood that when an element or layer is referred to as being "on," "connected to" or "coupled to" another element or layer, it can be directly on, connected or coupled to the other element or layer or intervening elements or layers may be present.

Figure 1:
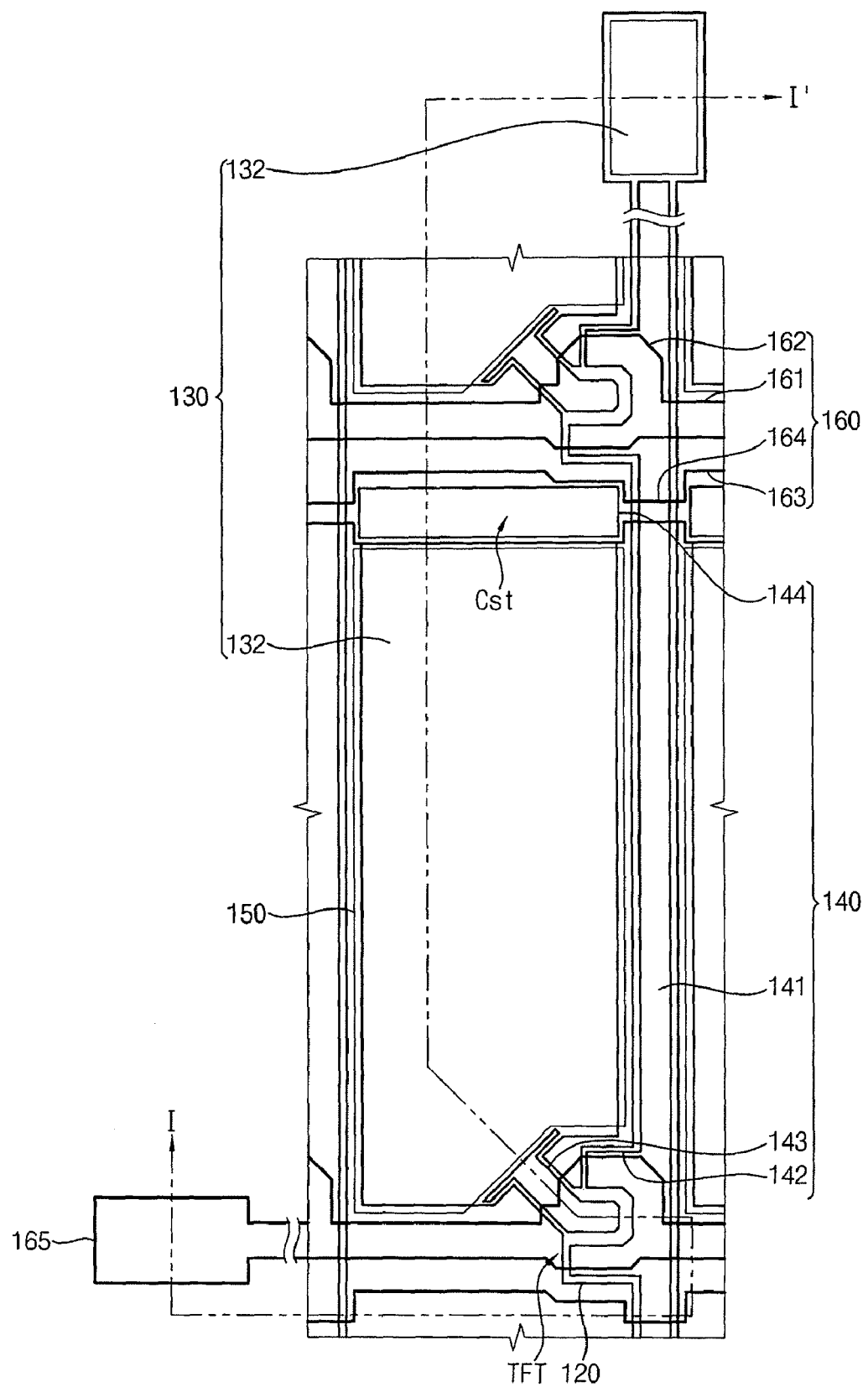
FIG. 1 is a plan view illustrating a thin-film transistor (TFT) substrate according to an exemplary embodiment of the present invention.
Figure 2:
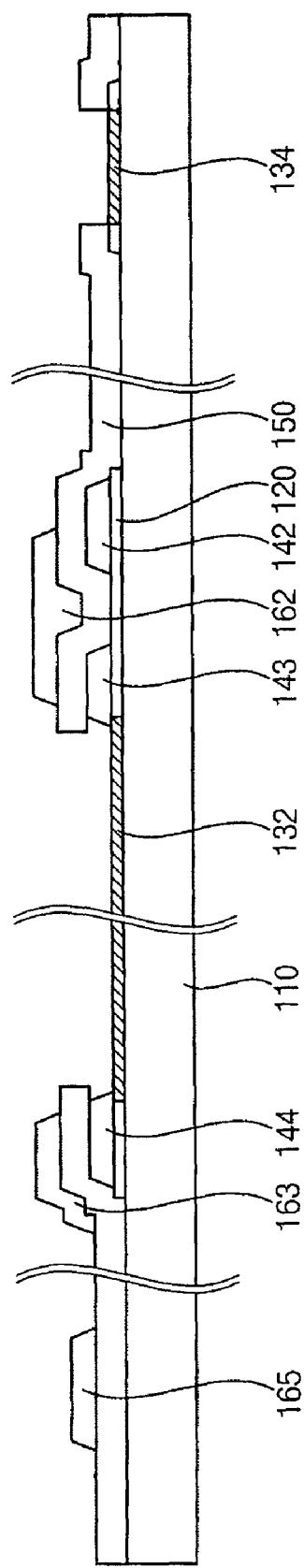
FIG. 2 is a cross-sectional view taken along the line I-I' of FIG. 1.

FIG. 1 is a plan view illustrating a thin-film transistor (TFT) substrate 100 according to an exemplary embodiment of the present invention. FIG. 2 is a cross-sectional view taken along the line I-I' of FIG. 1.

Referring to FIGS. 1 and 2, the TFT substrate 100 includes a substrate 110, a semiconductor pattern 120, a conductive pattern 130, a first wiring pattern 140, an insulation pattern 150 and a second wiring pattern 160.

The substrate 110 includes a transparent insulation material. For example, the substrate 110 includes transparent glass or plastic.

The semiconductor pattern 120 and the conductive pattern 130 are formed on the substrate 110. The first wiring pattern 140 is formed on the semiconductor pattern 120. The first wiring pattern 140 includes a data line 141, a source electrode 142 and a drain electrode 143.

The semiconductor pattern 120 is formed in a TFT area to form a channel of the TFT. The semiconductor pattern 120 and the first wiring pattern 140 are patterned using the same mask, so that the semiconductor pattern 120 may be formed below the data line 141, the source electrode 142 and the drain electrode 143.

The semiconductor pattern 120 includes a metal oxide semiconductor. For example, the metal oxide semiconductor may include zinc oxide (ZnO). For example, the metal oxide semiconductor may include indium (in) and/or gallium (Ga) in addition to the zinc oxide (ZnO) such that indium zinc oxide (IZO) and gallium indium zinc oxide (GIZO) can be used. In the GIZO, a ratio of gallium (Ga), indium (In) and zinc (Zn) is about 1:1:1 or about 2:2:1.

When the semiconductor pattern 120 is formed on the substrate 110, a leakage current caused by light applied from a lower portion of the substrate 110 is generated such that characteristics of the TFT may be decreased. However, when a metal oxide semiconductor is used in the semiconductor pattern 120, the generation of a leakage current by the light may be prevented.

The conductive pattern 130 may include an optically transparent and electrically conductive material. The conductive pattern 130 may be formed from the same layer as the semiconductor pattern 120. Therefore, the conductive pattern 130 may include a transparent metal oxide semiconductor like the semiconductor pattern 120. For example, the conductive pattern 130 may include IZO and/or GIZO. The conductive pattern 130 may include a conductive oxide material formed by a plasma process of a metal oxide semiconductor.

A metal oxide semiconductor may be converted to a conductive material through a plasma process. A gas such as, for example, argon (Ar) gas, sulfur hexafluoride ($SF_6$) gas, and a combination of sulfur hexafluoride ($SF_6$) gas and oxygen ($O_2$) gas may be used in the plasma process.

Figure 3:
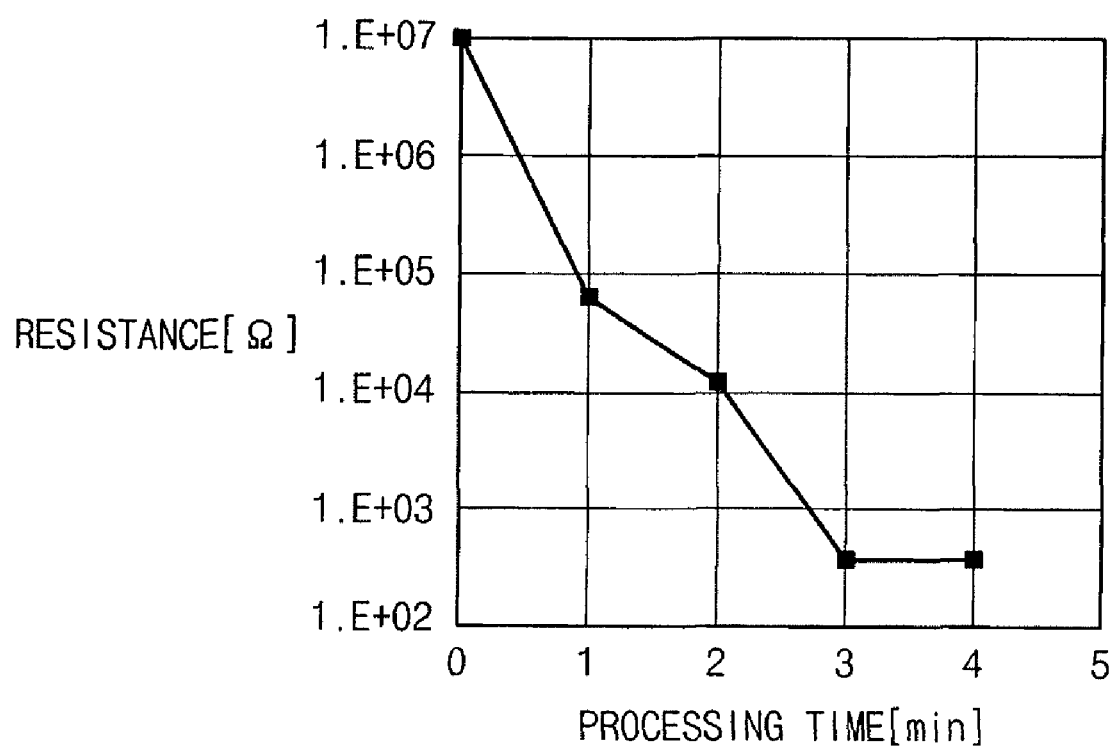
FIG. 3 is a graph illustrating a resistance variation of a gallium indium zinc oxide (GIZO) thin-film having copper doped thereon in a plasma process according to an exemplary embodiment of the present invention.

FIG. 3 is a graph illustrating a resistance variation of a GIZO thin-film having copper (Cu) doped thereon in a plasma process according to an exemplary embodiment of the present invention. In FIG. 3, argon (Ar) gas is used to perform the plasma process to the GIZO thin-film.

Referring to FIG. 3, when the argon (Ar) gas is used during the plasma process, a resistance of the GIZO thin-film is decreased as a plasma processing time is increased. Therefore, a metal oxide semiconductor may become a conductor selectively through a plasma process of the metal oxide semiconductor.

Referring to FIGS. 1 and 2, the conductive pattern 130 may include a pixel electrode 132 and a data pad 134.

The pixel electrode 132 is formed in each pixel, and is electrically connected to a drain electrode 143 of the TFT. To electrically connect to the pixel electrode 132 and the drain electrode 143, a portion of the pixel electrode 132 may overlap the drain electrode 143. A data signal delivered through the data line 141 is applied to the pixel electrode 132 via the drain electrode 143 when the TFT is turned on.

The data pad 134 is formed at an end portion of the data line 141. The data pad 134 contacts a data driving part (not shown), and provides the data line 141 with a data signal from the data driving part. A data signal applied to the data pad 134 is provided to the source electrode 142 of the TFT through the data line 141.

The first wiring pattern 140 is formed on the semiconductor pattern 120. The first wiring pattern 140 may include copper (Cu) to form a low resistance wiring. The first wiring pattern 140 may include, for example, a single-layer structure, a double-layer structure, or a multilayer structure. In an exemplary embodiment, when the first wiring pattern 140 includes the singled-layered structure, the first wiring pattern 140 is formed from a single metallic material such as, for example, aluminum (Al), molybdenum (Mo), neodymium (Nd), chromium (Cr), tantalum (Ta), titanium (Ti), tungsten (W), silver (Ag), or a metal alloy thereof. In an exemplary embodiment, when the first wiring pattern 140 includes the double-layer structure, a lower metal layer of the first metal pattern is formed from a metal such as, for example, aluminum (Al), and an upper metal layer of the first metal pattern is formed from a metal having low resistance such as, for example, molybdenum (Mo) or molybdenum alloy.

The first wiring pattern 140 includes the data line 141, the source electrode 142 and the drain electrode 143. The data line 141 is formed on the semiconductor pattern 120. The data line 141 is, for example, extended in a horizontal direction from a top view. The data line 141 delivers a data signal from the data pad 134 to the source electrode 142. The source electrode 142 is connected to the data line 141 to perform a function of a source terminal of the TFT. The drain electrode 143 is spaced apart from the source electrode 142 on the semiconductor pattern 120 to perform a function of a drain terminal of the TFT. In an exemplary embodiment, a line width of an overlapped portion between the drain electrode 143 and the pixel electrode 132 is greater than that of other portions, so that a contact resistance may be decreased.

The first wiring pattern 140 may include a first maintaining electrode 144 for forming a maintaining capacitor Cst. The first maintaining electrode 144 is formed in each pixel, and is electrically connected to the pixel electrode 132. To electrically connect the pixel electrode 132 and the first maintaining electrode 144, a portion of the pixel electrode 132 may overlap the first maintaining electrode 144.

The insulation layer pattern 150 is formed on the substrate 110 having the first wiring pattern 140 to cover the first wiring pattern 140. The insulation layer pattern 150 comprises, for example, silicon nitride (SiNx), or silicon oxide (SiOx). The insulation layer pattern 150 is formed in a portion of the substrate 110. That is, the conductive pattern 130 including, for example, the pixel electrode 132, or the data pad 134 is formed through a plasma process of a metal oxide semiconductor, so that the insulation layer pattern 150 corresponding to the pixel electrode 132 and the data pad 134 is removed to perform a plasma process of the metal oxide semiconductor formed below the insulation layer pattern 150. Therefore, the insulation layer pattern 150 is formed in the remaining area except for an area of the conductive pattern 130 including the pixel electrode 132 and the data pad 134.

The second wiring pattern 160 is formed on the insulation pattern 150. The second wiring pattern 160 may comprise the same material as the first wiring pattern 140. Alternatively, the second wiring pattern 160 may comprise a different material with the first wiring pattern 140. The second wiring pattern 160 may include copper (Cu) to form a low resistance wiring. The second wiring pattern 160 may include, for example, a single-layer structure, a double-layer structure, or a multilayer structure. In an exemplary embodiment, when the second wiring pattern 160 includes the singled-layered structure, the second wiring pattern 160 is formed from a single metallic material such as, for example, aluminum (Al), molybdenum (Mo), neodymium (Nd), chromium (Cr), tantalum (Ta), titanium (Ti), tungsten (W), silver (Ag) or a metal alloy thereof. In an exemplary embodiment, when the second wiring pattern 160 includes the double-layer structure, a lower metal layer of the first metal pattern comprises a metal having good mechanical and chemical characteristics such as, for example, aluminum (Al) and an upper metal layer of the first metal pattern comprises a metal having low resistance such as, for example, molybdenum (Mo) or molybdenum alloy.

The second wiring pattern 160 includes a gate line 161 and a gate electrode 162. The gate line 161 crosses the data line 141. For example, the gate line 161 is extended along a horizontal direction as shown in a top or plan view. The gate electrode 162 is electrically connected to the gate line 161, and is formed on the source electrode 142 and the drain electrode 143. The gate electrode 162 functions as a gate terminal of the TFT.

Accordingly, the gate electrode 162 electrically connected to the gate line 161, the source electrode 142 electrically connected to the data line 141, a drain electrode 143 spaced apart from the source electrode 142 and the semiconductor pattern 120 may define the TFT. The TFT provides the pixel electrode 132 with a data signal applied through the data line 141 in response to a gate voltage applied through the gate line 161.

The second wiring pattern 160 may include a maintaining wiring 164 having a second maintaining electrode 163 for forming the maintaining capacitor Cst. The maintaining wiring 164 is extended in parallel with the gate line 161. The second maintaining electrode 163 is spaced apart from the first maintaining electrode 144 by the insulation layer pattern 150 to form a maintaining capacitor Cst. Thus, a data signal applied to the pixel electrode 132 through the TFT is maintained during one frame by the maintaining capacitor Cst.

The second wiring pattern 160 may include a gate pad 165. The gate pad 165 is formed at an end portion of the gate line 161. The gate pad 165 contacts a gate driving part (not shown), and provides the gate line 161 with a gate signal. The gate signal applied to the gate pad 165 is provided to the gate electrode 162 of the TFT through the gate line 161.

FIGS. 4 to 14 are cross-sectional views illustrating a method of manufacturing a TFT substrate in accordance with an embodiment of the present invention.

Figure 4:
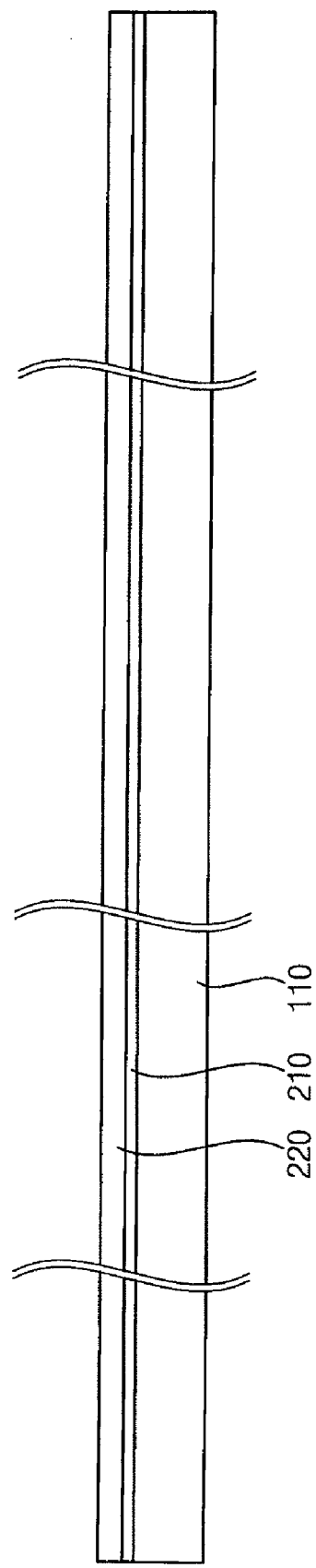
FIGS. 4 to 14 are cross-sectional views illustrating a method of manufacturing a TFT substrate in accordance with an exemplary embodiment of the present invention.

Referring to FIG. 4, an oxide semiconductor layer 210 and a first conductive layer 220 are sequentially formed on a substrate 110.

The oxide semiconductor layer 210 includes a metal oxide semiconductor. For example, the metal oxide semiconductor may include zinc oxide (ZnO). For example, the metal oxide semiconductor may include indium (In) and/or gallium (Ga) in addition to the zinc oxide (ZnO) such that indium zinc oxide (IZO) and gallium indium zinc oxide (GIZO) can be used. In the GIZO, a ratio of gallium (Ga), indium (In) and zinc (Zn) is about 1:1:1 or about 2:2:1.

The first conductive layer 220 may include copper (Cu) to form a low resistance wiring. The first conductive layer 220 may include, for example, a single-layer structure, a double-layer structure, and a multilayer structure. In an exemplary embodiment, when the first conductive layer 220 includes the singled-layered structure, the first conductive layer 220 is formed from a single metallic material such as, for example, aluminum (Al), molybdenum (Mo), neodymium (Nd), chromium (Cr), tantalum (Ta), titanium (Ti), tungsten (W), silver (Ag), or a metal alloy thereof. In an exemplary embodiment, when the first conductive layer 220 includes the double-layer structure, a lower metal layer of the first metal pattern comprises metal having good mechanical and chemical characteristics such as, for example, aluminum (Al) and an upper metal layer of the first metal pattern comprises metal having relatively low resistance such as, for example, molybdenum (Mo), or molybdenum alloy.

Figure 5:
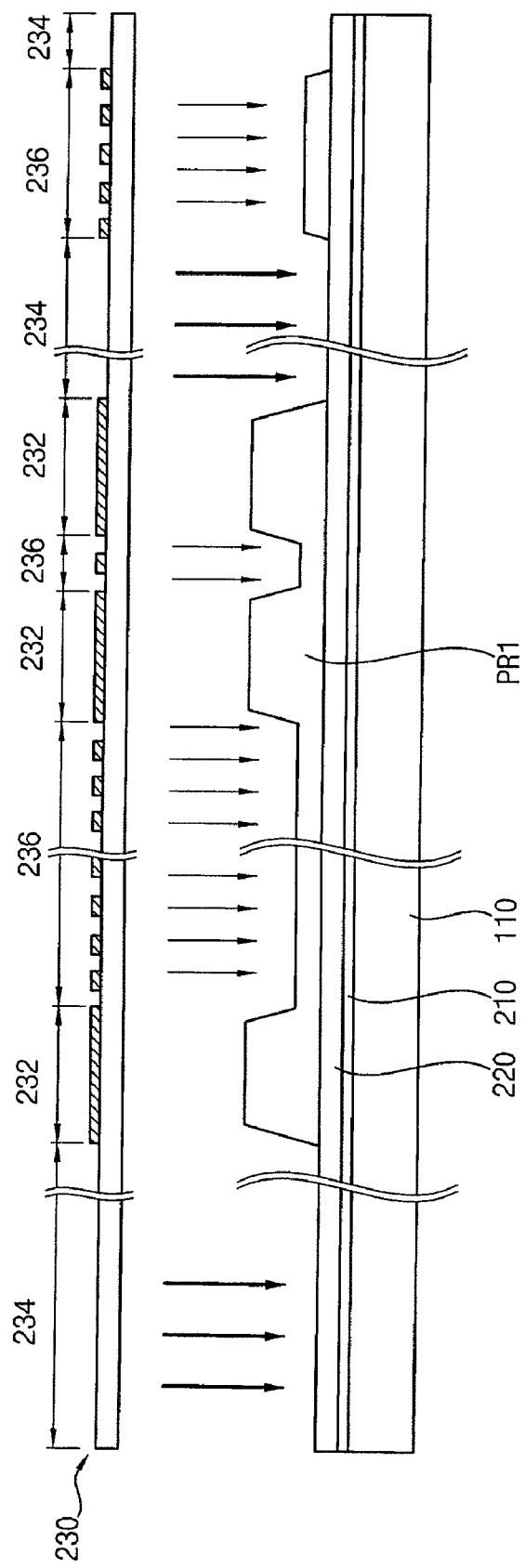

Referring to FIGS. 1 and 5, a first photoresist layer PR1 is formed on the first conductive layer 220 using a first mask 230.

For example, a photoresist material is deposited on the first conductive layer 220 with a predetermined thickness to form a photoresist film, and then the photoresist film is patterned through a photolithograph process using the first mask 230 to form the first photoresist pattern PR1. In an exemplary embodiment, the first mask 230 includes a blocking portion 232 blocking light, a transmitting portion 234 substantially or fully transmitting light and a semi transmitting portion 236 transmitting light smaller than the transmitting portion 234. Therefore, the first photoresist pattern PR1 has a first thickness on an area corresponding to the first wiring pattern 140, and a second thickness thinner than the first thickness on an area corresponding to the conductive pattern 130.

Figure 6:
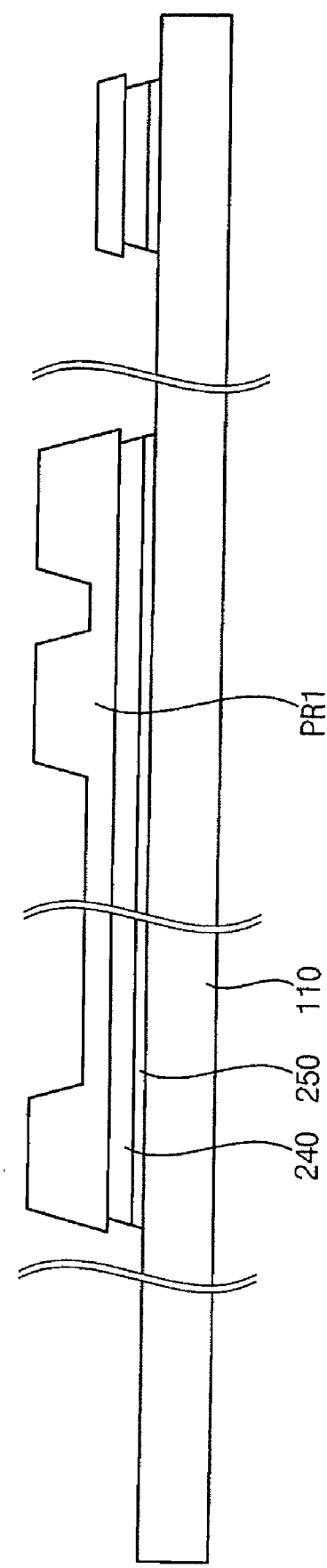

Referring to FIGS. 5 and 6, the first conductive layer 220 and the oxide semiconductor layer 210 are etched, using the first photoresist pattern PR1 as an etch-step layer, to form a first conductive pattern layer 240 from the first conductive layer 220 and a semiconductor pattern layer 250 from the oxide semiconductor layer 210.

Figure 7:
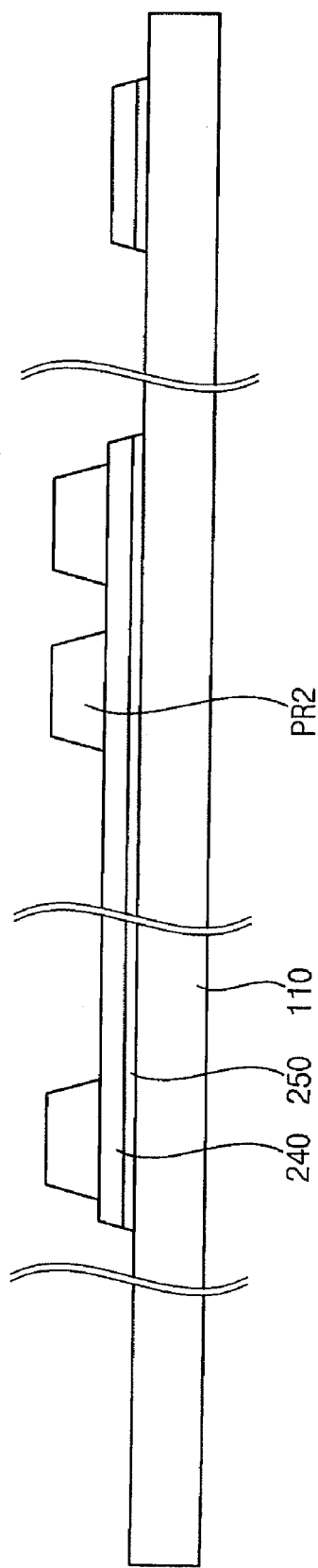

Referring to FIGS. 1 and 7, a second phororesist pattern PR2 is formed through an etch back process where the first photoresist pattern PR1 is decreased by a predetermined thickness. In an exemplary embodiment, the second photoresist pattern PR2 substantially remains in an area corresponding to the conductive pattern 130.

Figure 8:
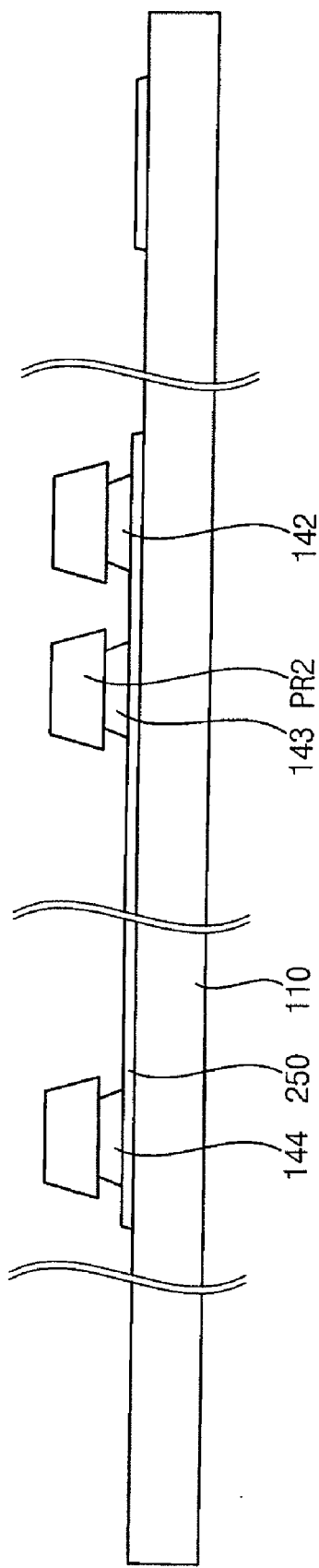

Referring to FIGS. 1 and 8, the first conductive pattern layer 240 is etched, using the second photoresist pattern PR2 as an etch-step layer, to form a first wiring pattern 140. The first wiring pattern 140 includes the data line 141, the source electrode 142, the drain electrode 143, and the first maintaining electrode 144. Then, the second photoresist pattern PR2 is removed.

In an exemplary embodiment, the semiconductor pattern layer 250 and the first wiring pattern 140 are formed using one mask.

Figure 9:
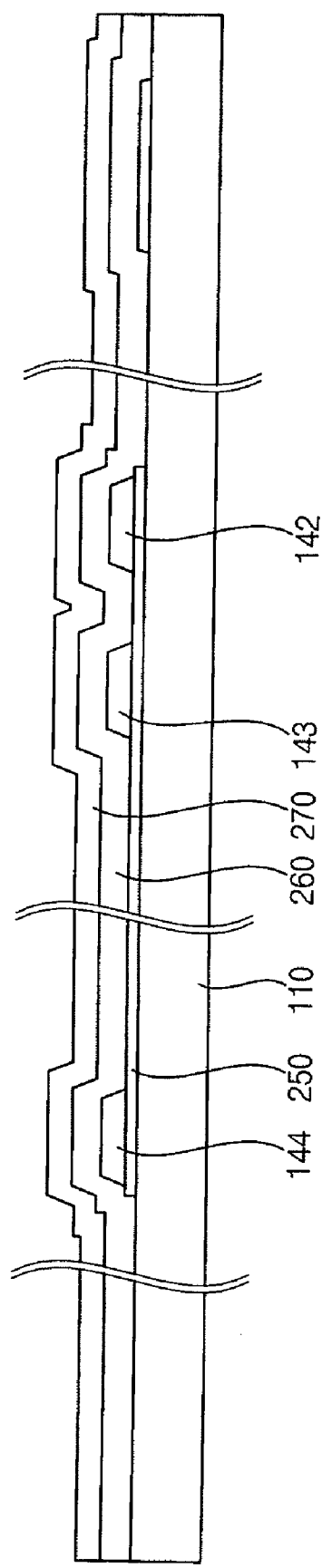

Referring to FIG. 9, an insulation layer 260 and a second conductive layer 270 are sequentially formed on the substrate 110 having the first wiring pattern 140.

The insulation layer 260 comprises, for example, silicon nitride (SiNx), or silicon oxide (SiOx).

The second conductive layer 270 may include the same material with first wiring pattern 140. Alternatively, the second conductive layer 270 may include a different material from that of the first wiring pattern 140. For example, the second conductive layer 270 may include a low resistance material such as, for example, copper (Cu). Alternatively, the second conductive layer 160 may include at least one of aluminum (Al), molybdenum (Mo), neodymium (Nd), chrome (Cr), tantalum (Ta), titanium (Ti), tungsten (W), silver (Ag), or an alloy thereof. The second layer 270 may include a single-layer structure or a multilayer structure. In an exemplary embodiment, the multilayer structure may include a chromium layer and aluminum-neodymium alloy layer.

Figure 10:
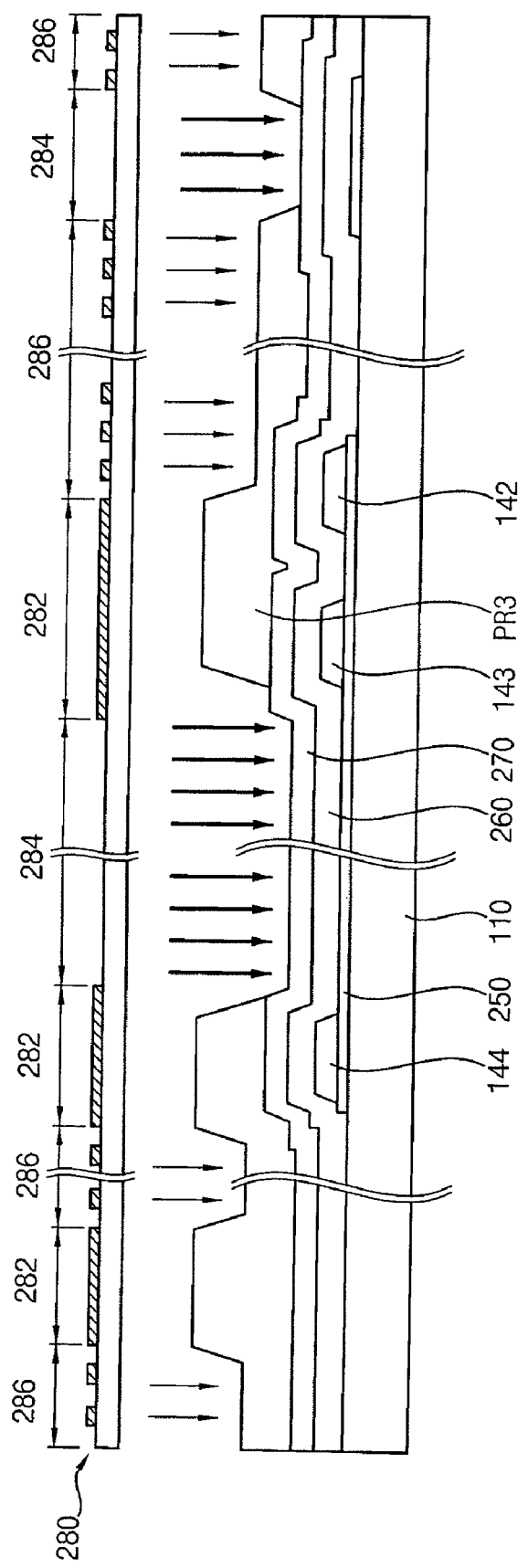

Referring to FIGS. 1 and 10, a third photoresist layer PR3 is formed on the second conductive layer 270 using a second mask 280.

For example, a photoresist material is deposited on the second conductive layer 270 with a predetermined thickness to form a photoresist film, and then the photoresist film is patterned through a photolithograph process using the second mask 280 to form the third photoresist pattern PR3. In an exemplary embodiment, the second mask 280 includes a blocking portion 282 blocking light, a transmitting portion 284 substantially or fully transmitting light and a semi-transmitting portion 286 transmitting light smaller than the transmitting portion 284. Therefore, the third photoresist pattern PR3 has a first thickness on an area corresponding to the second wiring pattern 160, and a second thickness thinner than the first thickness on an area corresponding to the insulation layer pattern 150.

Figure 11:
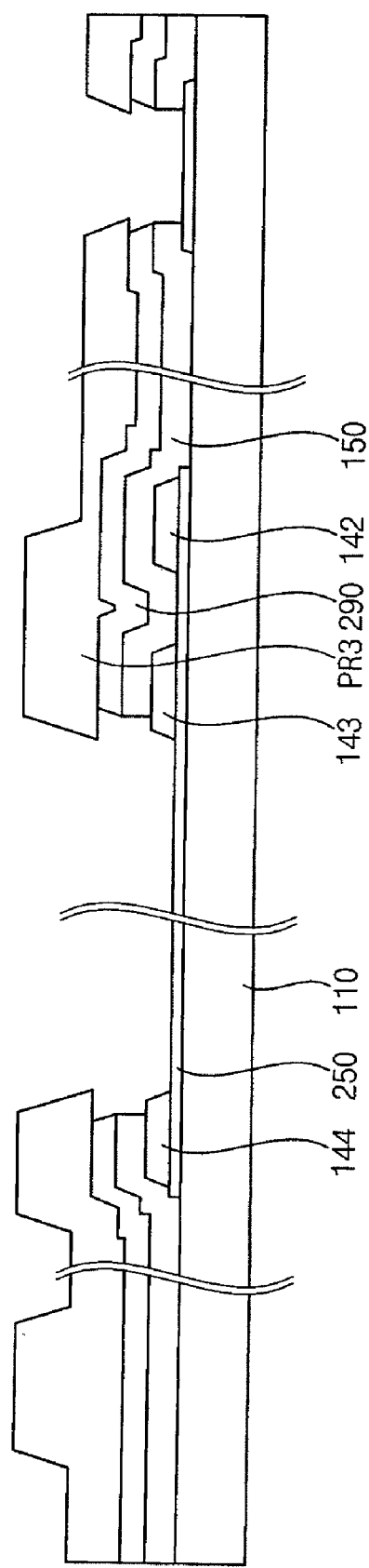

Referring to FIGS. 1 and 11, the second conductive layer 270 is etched, using the third photoresist pattern PR3 as an etch-step layer, to form a second conductive pattern layer 290. The first etching process can be a wet etching process.

Then, the insulation layer 260 is etched to form an insulation layer pattern 150. The etching process of the insulation layer 260 can be a dry etching process.

When the insulation layer pattern 150 is formed, the insulation layer 260 is etched to expose a portion of edges of the first wiring pattern 140. When the insulation layer 260 is etched to cover outer sides of the first wiring pattern 140 during an etching process of the insulation layer 260, an area where a plasma process is not performed is formed. The area is formed between the conductive pattern 130 and the first wiring pattern 140, both of which are formed through a plasma process of the semiconductor pattern layer 250. Therefore, a high resistance is generated between the conductive pattern 130 and the first wiring pattern 140. Accordingly, the insulation layer 260 of an edge area of the first wiring pattern 140 adjacent the conductive pattern 130 is removed, and then the plasma process of the semiconductor pattern 250 is performed using the first wiring pattern 140, exposed by removing the insulation layer 260, as a mask. As such, a high resistance portion between the conductive pattern 130 and the first wiring pattern 140 can be removed.

Figure 12:
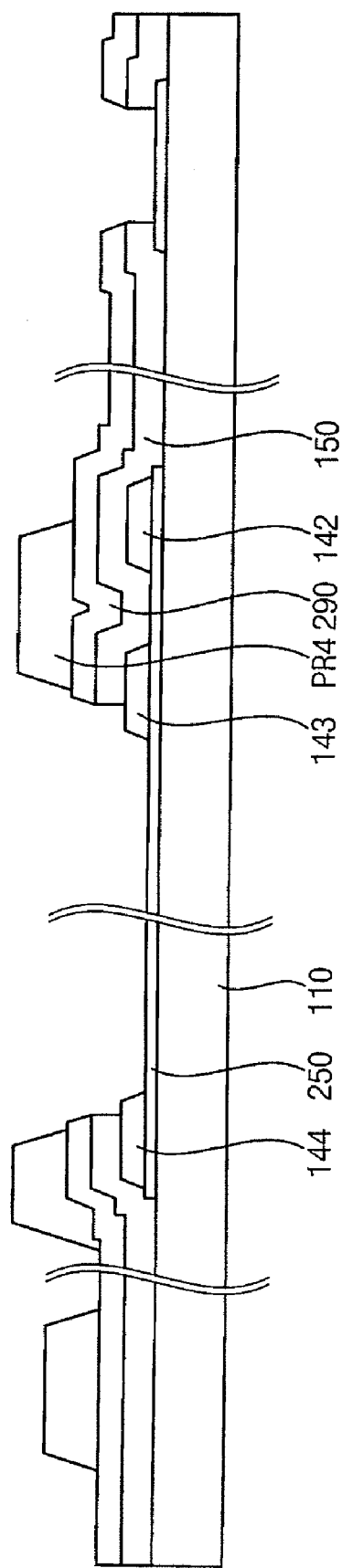

Referring to FIGS. 1 and 12, a fourth photoresist pattern PR4 is formed through an etch back process that decreases a thickness of the third photoresist pattern PR3. In an exemplary embodiment, the fourth photoresist pattern PR4 substantially remains in an area corresponding to the second wiring pattern 160.

Figure 13:
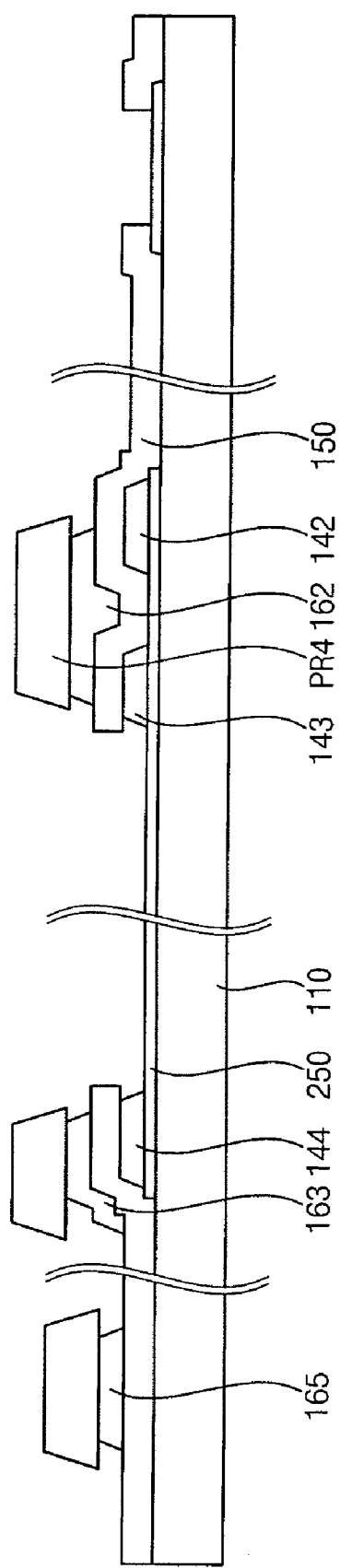

Referring to FIGS. 1 and 13, the second conductive pattern layer 290 is etched, using the fourth photoresist pattern PR4 as an etch-step layer, to form the second wiring pattern 160. The wiring pattern 160 includes the gate line 161, the gate electrode 162, the second maintaining electrode 163, and the gate pad 165.

When etching characteristics of the first conductive layer 220 for forming the first wiring pattern 140 are different from those of the second conductive layer 270 for forming the second wiring pattern 160, an under cut of the first wiring pattern 140 may be prevented during an etching process of the second conductive pattern layer 290.

Figure 14:
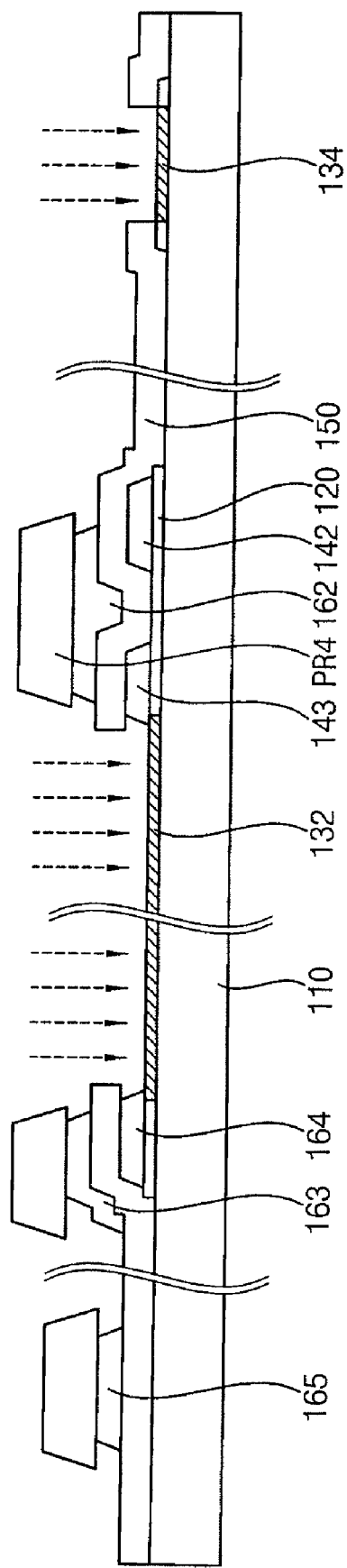

Referring to FIGS. 1 and 14, a portion area of the semiconductor pattern layer 250 is etched through a plasma process to form a conductive pattern 130 and a semiconductor pattern 120. In an exemplary embodiment, the conductive pattern 130 is an area of the semiconductor pattern layer 250 that is changed into a substantially conductive material by a plasma process, and the semiconductor pattern 120 is an area of a metal oxide semiconductor where the semiconductor pattern layer 250 is not processed by the plasma processing. The conductive pattern 130 formed through the plasma processing of the semiconductor pattern layer 250 includes the pixel electrode 132 and the data pad 134.

A plasma process of the semiconductor pattern layer 250 is performed by using the first and second wiring patterns 140 and 160 as a mask. A gas such as, for example, argon (Ar) gas, sulfur hexafluoride (SF6) gas, a combination of sulfur hexafluoride (SF6) gas or oxygen (O2) gas may be used in the plasma process.

Since edge portions of the drain electrode 143 and the first maintaining electrode 144 are not covered by the insulation layer pattern 150, a plasma process is performed in a portion of the semiconductor pattern layer 250 fully exposed from the first and second wiring patterns 140 and 160 and is performed at the edge portions of the drain electrode 143 and the first maintaining electrode 144. Therefore, an electric connection of low resistance between the conductive pattern 130 and the drain electrode 143 may be formed. An electrical connection of low resistance between the conductive pattern 130 and the first maintaining electrode 144 may be formed.

Then, the fourth photoresist pattern PR4 is removed. Alternatively, the removing of the fourth photoresist pattern PR4 may be performed before performing a plasma process of the semiconductor pattern layer 250.

In an exemplary embodiment, the TFT substrate 100 using two masks is manufactured, so that manufacturing costs may be decreased.

Figure 15:
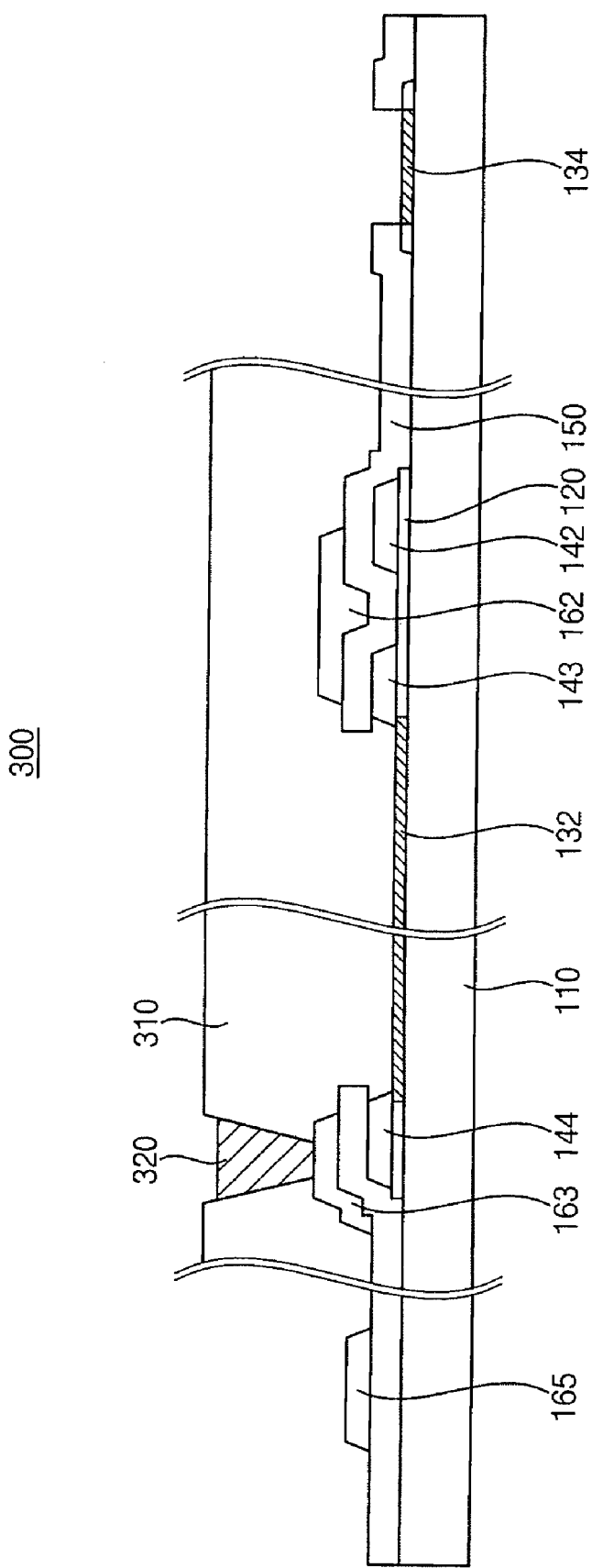
FIG. 15 is a cross-sectional view illustrating a TFT substrate according to an exemplary embodiment of the present invention.

FIG. 15 is a cross-sectional view illustrating a TFT substrate according to an exemplary embodiment of the present invention. The TFT substrate is substantially the same as the TFT substrate described with respect to FIGS. 1 and 2 except for a color filter layer and a black matrix.

Referring to FIGS. 1 and 15, the TFT substrate 300 according to an exemplary embodiment of the present invention may further include a color filter layer 310 and a black matrix 320.

The color filter layer 310 is formed on the substrate 110 having the second wiring pattern 160. The color filter layer 310 may include a red color filter, a green color filter and a blue color filter formed corresponding to each pixel. For example, the red, green and blue color filters may include an organic composition material, and red, green and blue pigments.

The black matrix 320 is formed on the substrate 110 having the color filter layer 310. The black matrix 320 may be formed, for example, in a boundary area of the pixels, a channel portion of the TFT, a maintaining capacitor Cst area, and a peripheral area thereof. The black matrix 320 blocks a peripheral light applied to a channel of the TFT, and prevents backlight leakages in the boundary area of the pixels and the peripheral area of the TFT substrate 300. The black matrix 320 may include a light blocking material. For example, the black matrix 320 may include a black organic material absorbing light.

The color filter layer 310 can be formed prior to the black matrix 320. Alternatively, the black matrix 320 can be formed prior to the color filter layer 310.

Figure 16:
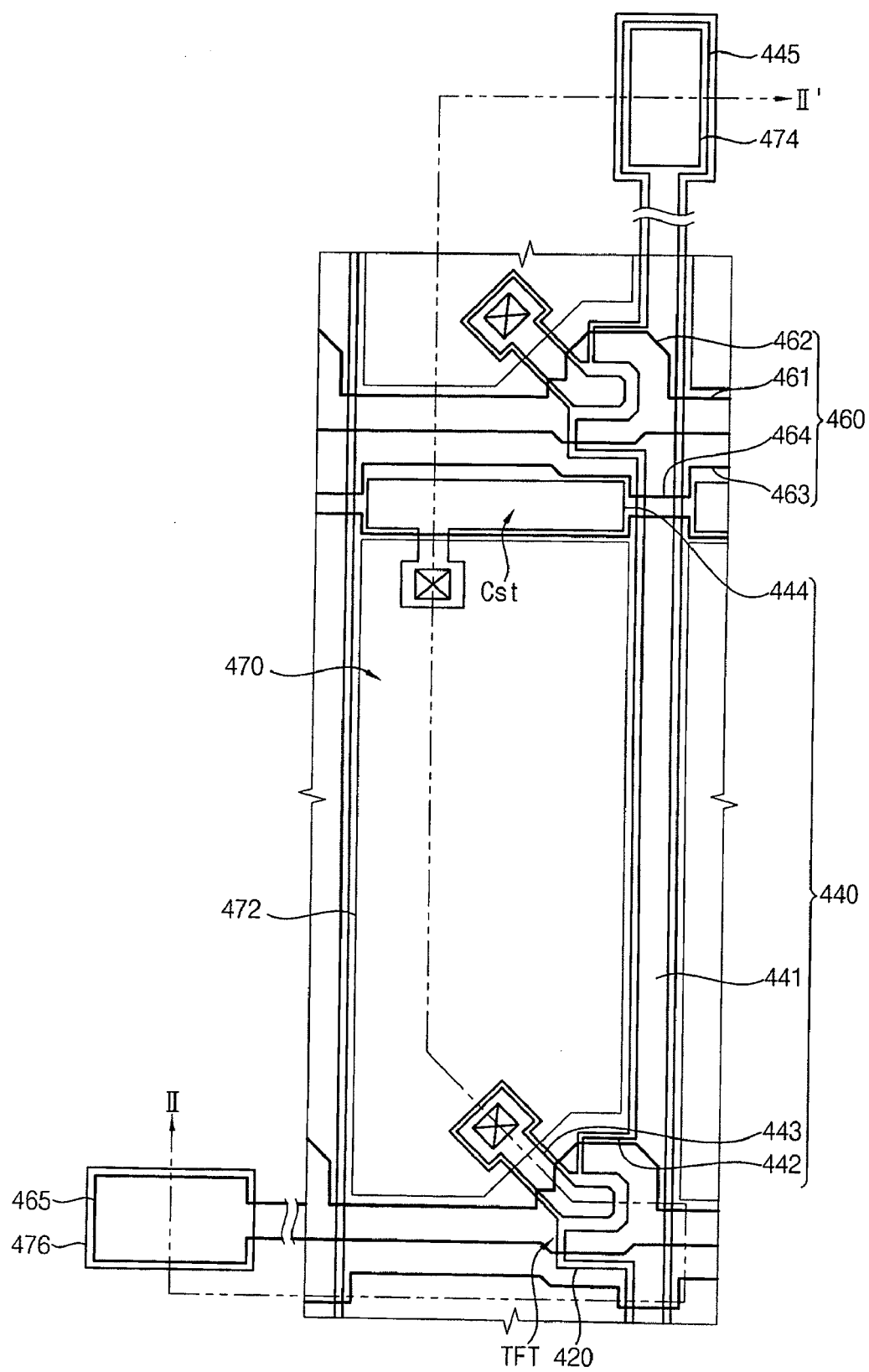
FIG. 16 is a plan view illustrating a TFT substrate according to an exemplary embodiment of the present invention.
Figure 17:
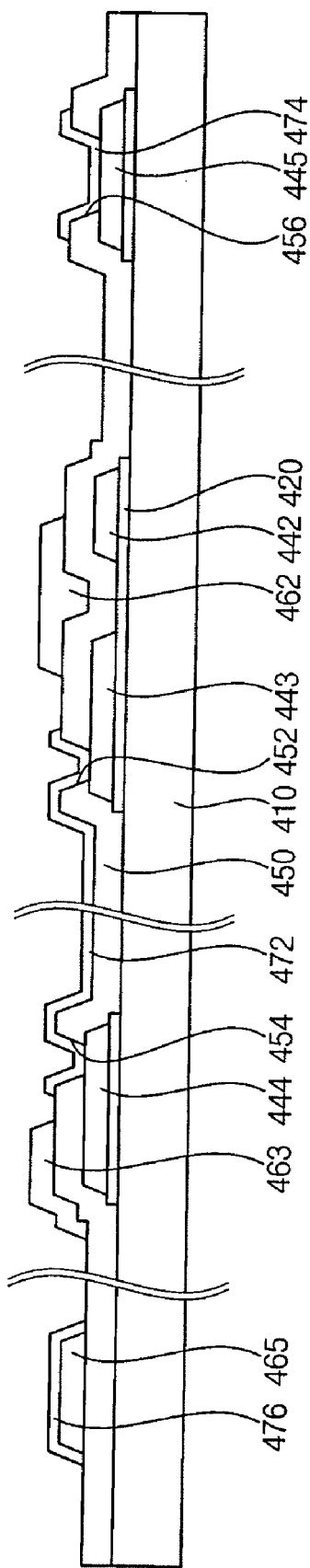
FIG. 17 is a cross-sectional view taken along the line II-II' of FIG. 16.

FIG. 16 is a plan view illustrating a TFT substrate according to an exemplary embodiment of the present invention. FIG. 17 is a cross-sectional view taken along the line II-II' of FIG. 16.

Referring to FIGS. 16 and 17, the TFT substrate 400 includes a substrate 410, a semiconductor pattern 420, a first wiring pattern 440, an insulation pattern 450, a second wiring pattern 460 and a conductive pattern 470.

The semiconductor pattern 420 is formed on the substrate 410, and the first wiring pattern 440 is formed on the semiconductor pattern 420. The first wiring pattern 440 may include a data line 441, a source electrode 442 and a drain electrode 443.

The semiconductor pattern 420 is formed in at least the TFT area to form a channel of the TFT. The semiconductor pattern 420 is patterned using an identical mask used to pattern the first wiring pattern 440, so that the semiconductor pattern 420 may be formed under the first wiring pattern 440.

The semiconductor pattern 420 includes a metal oxide semiconductor. For example, the metal oxide semiconductor may include zinc oxide (ZnO). For example, the metal oxide semiconductor may include indium (In) and/or gallium (Ga) in addition to the zinc oxide (ZnO) such that indium zinc oxide (IZO) and gallium indium zinc oxide (GIZO) can be used. In the GIZO, a ratio of gallium (Ga), indium (In) and zinc (Zn) is about 1:1:1 or about 2:2:1.

The first wiring pattern 440 is formed on the semiconductor pattern 420. The first wiring pattern 440 may include a low resistance material such as copper (Cu). In an exemplary embodiment, the first wiring pattern 440 may include at least one of aluminum (Al), molybdenum (Mo), neodymium (Nd), chromium (Cr), tantalum (Ta), titanium (Ti), tungsten (W), silver (Ag), or an alloy thereof. The first wiring pattern 440 may include a single-layer structure or a multilayer structure.

The first wiring pattern 440 may include a data line 441, a source electrode 442 and a drain electrode 443. The first wiring pattern 440 may further include a first maintaining electrode 444 for forming the maintaining capacitor Cst and a data pad 445 electrically connected to an end terminal of the first data line 441.

An insulation layer pattern 450 is formed on the substrate 410 having the first wiring pattern 440 to cover the first wiring pattern 440. The insulation layer pattern 450 may comprise, for example, silicon nitride (SiNx), or silicon oxide (SiOx). The insulation layer pattern 450 may have a first contact hole 452 exposing at least a portion of the drain electrode 443, a second contact hole 454 exposing at least a portion of the first maintaining electrode 444 and a third contact hole 456 exposing at least a portion of the data pad 445.

The second wiring pattern 460 is formed on the insulation pattern 450. The second wiring pattern 460 may include the same material as the first wiring pattern 440. Alternatively, the second wiring pattern 460 may include a different material from the first wiring pattern 440. For example, the second wiring pattern 460 may include a low resistance material such as copper (Cu). In an exemplary embodiment, the second wiring pattern 460 may include at least one of aluminum (Al), molybdenum (Mo), neodymium (Nd), chromium (Cr), tantalum (Ta), titanium (Ti), tungsten (W), silver (Ag), or an alloy thereof. The second wiring pattern 460 may include a single-layered structure or a multiple-layered structure.

The second wiring pattern 460 includes a gate line 461 and a gate electrode 462. The second wiring pattern 460 may further include a maintaining wiring 464 including a second maintaining electrode 463 for forming the maintaining capacitor Cst. The second wiring pattern 460 may further include a gate pad 465 electrically connected to an end terminal of the gate line 461.

The conductive pattern 470 is formed of an optically transparent and electrically conductive material. For example, the conductive pattern 470 is formed of IZO, indium tin oxide (ITO), etc.

The conductive pattern 470 includes a pixel electrode 472 formed in each pixel. The pixel electrode 472 is electrically connected to the drain electrode 443 of the TFT through the first contact hole 452, and is electrically connected to the maintaining electrode 444 through the second contact hole 454.

The conductive pattern 470 may further include a first pad electrode 474 formed on the data pad 445, and a second pad electrode 476 formed on the gate pad 465. The first and second pad electrodes 474 and 476 can be a protecting layer of the data pad 445 and the gate pad 465.

Referring to FIGS. 16 and 17, an oxide semiconductor layer including a metal oxide semiconductor and a first conductive layer including a metal such as, for example, copper (Cu), are sequentially formed on a substrate 410. Then, a semiconductor pattern 420 and a first wiring pattern 440 are formed through a photolithograph process using a first mask. The first wiring pattern 440 includes a data line 441, a source electrode 442, a drain electrode 443, a first maintaining electrode 444, and a data pad 445.

Then, an insulation layer including, for example, a silicon nitride (SiNx) and a second conductive layer including a metal such as, for example, copper (Cu) are sequentially formed on the substrate 410 having the semiconductor layer 420 and the first wiring pattern 440. An insulation layer pattern 450 including first, second and third contact holes 452, 454 and 456, and a second wiring pattern 460 including, for example, a gate line 461, a gate electrode 462, a maintaining wiring 464 and a gate pad 465 are formed through a photolithograph process using a second mask. The maintaining wiring 464 includes a second maintaining electrode 463.

Then, a third conductive layer including an optically transparent and electrically conductive material such as, for example, IZO is formed on the substrate 410 having the insulation layer pattern 450 and the second wiring pattern 460. Then, a conductive pattern 470 including, for example, a pixel electrode 472, and first and second pad electrodes 474 and 476 is formed through a photolithograph process using a third mask.

In an exemplary embodiment, the TFT substrate 400 using three masks is manufactured, so that manufacturing costs may be decreased in comparison with a method of manufacturing the TFT substrate using four masks.

Figure 18:
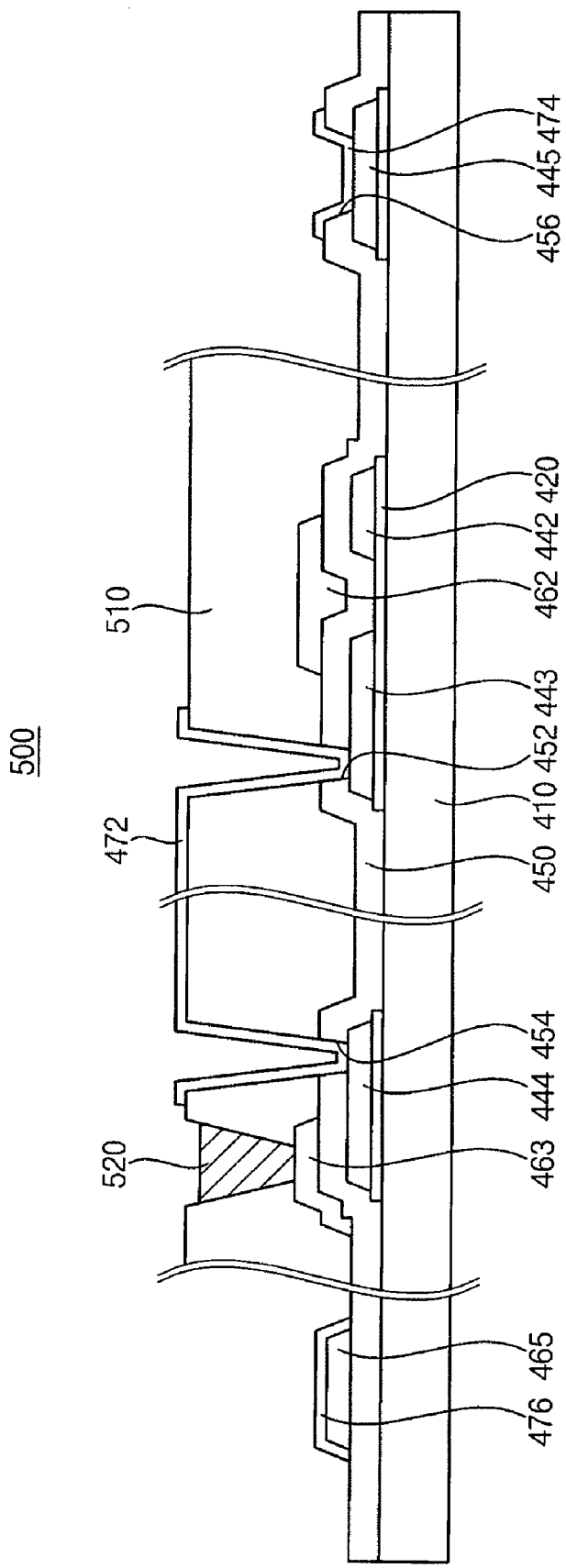
FIG. 18 is a plan view illustrating a TFT substrate according to an exemplary embodiment of the present invention.

FIG. 18 is a plan view illustrating a TFT substrate according to an exemplary embodiment of the present invention. The TFT substrate is substantially the same as the TFT substrate described with respect to FIGS. 16 and 17 except for a color filter layer and a black matrix.

Referring to FIG. 18, a TFT substrate 500 includes a color filter layer 510 and a black matrix 520.

The color filter layer 510 is formed on the substrate 110 having the second wiring pattern 160. The color filter layer 510 may include a red color filter, a green color filter and a blue color filter formed corresponding to each pixel. For example, the red, green and blue color filters may include an organic composition material, and red, green and blue pigments.

The color filter layer 510 has a thickness enough to planarize a surface of the TFT substrate 500. For example, a thickness of the color filter layer 510 is about 2.5 micrometers to about 3.5 micrometers.

The black matrix 520 is formed on the substrate 410 having the color filter layer 510. For example, the black matrix 520 may be formed in a boundary area of the pixels, a channel portion of the TFT, a maintaining capacitor Cst area, or a peripheral area thereof.

In an exemplary embodiment, the pixel electrode 472 is formed on the color filter layer 510. Therefore, the color filter layer 510 is formed between the second wiring pattern 440 including the data line 441, the source electrode 442 and the drain electrode 443 and the pixel electrode 472. The color filter layer 510 has enough thickness so that a parasitic capacitance of a parasitic capacitor generated between the pixel electrode 472 and the second wiring pattern 440 may be reduced.

The color filter layer 510 can be formed prior to the black matrix 520. Alternatively, the black matrix 520 is formed prior to the color filter layer 510.

Although exemplary embodiments of the present invention have been described herein with reference to the accompanying drawings, it is to be understood that the present invention should not be limited thereto and that various other changes and modifications may be affected therein by one of ordinary skill in the related art without departing from the scope or spirit of the invention. All such changes and modifications are intended to be included within the scope of the invention.

What is claimed is:

1. A method of manufacturing a thin-film transistor (TFT) substrate, the method comprising:
    forming a semiconductor pattern layer on a substrate and a first wiring pattern on a top surface of the semiconductor pattern layer using a first mask, the first wiring pattern including an entire source electrode and an entire drain electrode spaced apart from the source electrode;
    forming an insulation layer pattern covering the first wiring pattern and a second wiring pattern on the insulation layer pattern using a second mask, the second wiring pattern including a gate electrode formed on the source and drain electrodes; and
    applying a plasma to a portion of the semiconductor pattern layer, which is uncovered by the insulation layer pattern, to change the portion of the semiconductor pattern layer to a conductive pattern.

2. The method of claim 1, wherein forming the semiconductor pattern layer and the first wiring pattern comprises:
    forming a metal oxide semiconductor and then a first conductive layer;
    forming a first photoresist pattern on the first conductive layer using the first mask;
    etching the first conductive layer and the metal oxide semiconductor to form a first conductive pattern layer from the first conductive layer and a second conductive pattern layer from the metal oxide semiconductor layer;
    performing an etch back process to the first photoresist pattern to form a second photoresist pattern; and
    etching the first conductive pattern to form the first wiring pattern.

3. The method of claim 1, further comprising forming a color filter layer and a black matrix.

4. The method of claim 2, wherein forming the insulation layer pattern and the second wiring pattern comprises:
  forming an insulation layer and then a second conductive layer on a substrate having the first wiring pattern;
  forming a third photoresist pattern on the second conductive layer using the second mask;
  etching the second conductive layer to form a second conductive pattern layer;
  etching the insulation layer to form the insulation layer pattern;
  performing an etch back process to the third photoresist pattern to form a fourth photoresist pattern; and
  etching the second conductive pattern layer to form a second wiring pattern.

5. The method of claim 4, in etching the insulation layer to form the insulation layer pattern, wherein the insulation layer is etched to expose a portion of an edge of the first wiring pattern.

6. The method of claim 5, wherein the plasma process of the semiconductor pattern layer uses the first and second wiring patterns as a mask.

7. A method of manufacturing a thin-film transistor (TFT) substrate, the method comprising:
  forming a semiconductor pattern, which forms a channel of the thin-film transistor, on a substrate and a first wiring pattern on a top surface of the semiconductor pattern using a first mask, the semiconductor pattern including a metal oxide semiconductor, and the first wiring pattern including an entire source electrode and an entire drain electrode spaced apart from the source electrode;
  forming an insulation layer pattern covering the first wiring pattern and a second wiring pattern on the insulation layer pattern using a second mask, the second wiring pattern including a gate electrode formed on the source and drain electrodes;
  forming a color filter layer covering the gate electrode and the insulation layer pattern; and
  forming a conductive pattern on the color filter layer using a third mask, the conductive pattern including a pixel electrode electrically connected to the drain electrode.

8. The method of claim 7, further comprising forming a a light-blocking layer.

* * * * *